(12) United States Patent
Baars et al.

(10) Patent No.: US 8,883,586 B2
(45) Date of Patent: Nov. 11, 2014

(54) MOL INSITU PT REWORK SEQUENCE

(75) Inventors: Peter Baars, Dresden (DE); Marco Lepper, Dresden (DE); Uwe Kahler, Dresden (DE); Vivien Schroeder, Ottendorf-Okrilla (DE)

(73) Assignee: GlobalFoundries Inc., Grand Cayman (KY)

( * ) Notice: Subject to any disclaimer, the term of this patent is extended or adjusted under 35 U.S.C. 154(b) by 891 days.

(21) Appl. No.: 13/079,492

(22) Filed: Apr. 4, 2011

(65) Prior Publication Data

US 2012/0248551 A1 Oct. 4, 2012

(51) Int. Cl.
| | |
|---|---|
| H01L 21/336 | (2006.01) |
| H01L 21/8234 | (2006.01) |
| H01L 21/3213 | (2006.01) |
| H01L 21/285 | (2006.01) |
| H01L 29/66 | (2006.01) |
| H01L 29/78 | (2006.01) |
| H01L 21/02 | (2006.01) |

(52) U.S. Cl.
CPC ...... *H01L 29/7843* (2013.01); *H01L 21/32134* (2013.01); *H01L 21/28518* (2013.01); *H01L 29/665* (2013.01); *H01L 21/02068* (2013.01); *H01L 29/6653* (2013.01)
USPC .......................................... 438/199; 438/586

(58) Field of Classification Search
USPC ................... 438/197–201, 583–592, E27.062
See application file for complete search history.

(56) References Cited

U.S. PATENT DOCUMENTS

| 8,283,223 B2 * | 10/2012 | Iwamoto | 438/199 |
| 8,390,050 B2 * | 3/2013 | Hirai | 438/199 |

* cited by examiner

*Primary Examiner* — Cuong Q Nguyen
(74) *Attorney, Agent, or Firm* — Ditthavong & Steiner, P.C.

(57) ABSTRACT

The amount of Pt residues remaining after forming Pt-containing NiSi is reduced by performing an $O_2$ flash while shaping gate spacers, and then cleaning and applying a second application of Aqua Regia. Embodiments include sputter depositing a layer of Ni/Pt on a semiconductor substrate, annealing the Ni/Pt layer, wet stripping unreacted Ni, annealing the Ni stripped Ni/Pt layer, stripping unreacted Pt from the annealed Ni/Pt layer, e.g., with Aqua Regia, treating the Pt stripped Ni/Pt layer with an oxygen plasma, cleaning the Ni/Pt layer, and stripping unreacted Pt from the cleaned Ni/Pt layer, e.g., with a second application of Aqua Regia.

12 Claims, 3 Drawing Sheets

MOL INSITU PT REWORK SEQUENCE

TECHNICAL FIELD

The present disclosure relates to semiconductor silicidation with reduced platinum (Pt) residues. The present disclosure is particularly applicable to gate first technologies.

BACKGROUND

Conventional silicidation techniques employ nickel (Ni)/Pt as a sputter target. The Pt serves as a nickel silicide (NiSi) stabilizer and as an etch stop for a subsequent contact etch. After the NiSi formation sequence of sputtering Ni/Pt and performing a first rapid thermal anneal (RTA), a sulfuric acid-hydrogen peroxide mixture (SPM) is applied to wet strip unreacted Ni. Since SPM fails to strip unreacted Pt, after a second RTA, concentrated Aqua Regia (1:4) (nitric acid ($HNO_3$) plus hydrochloric acid (4HCl)) is employed to strip the unreacted Pt. The HCl yields chloride ions which react with Pt according to formula 1 to form chloroplatinate ion ($PtCl_6$), which in turn is soluble and forms chloroplatinous acid ($H_2PtCl_4$).

$$Pt^{4+}(aq) + 6\ Cl^-(aq) \rightarrow PtCl_6^{2-}(aq) \quad \text{Formula 1}$$

The Pt strip process is only effective if the Pt is not bound and can freely react to form the chloroplatinate. If the Pt has formed an organic or oxygenic complex (Pt—C or Pt—O), the reaction with Aqua Regia will not occur, and Pt will remain on the wafer. Furthermore, in addition to the chloroplatinous acid, nitrosoplatinic chloride (($NO_2)_2PtCl_4$) is produced, which is insoluble and may result in redeposition. The aforementioned residues lead to significant yield loss, since they are large and cause contact-to-gate shorts.

Pt excursions have occurred in waves. Currently, Pt excursion is observed more significantly on 45 nm technology, typically affecting all wafers of a lot. It was also observed that 32 nm technology has experienced Pt residues. Attempts to eliminate Pt excursions have been applied only when scanned wafers have been affected. However, since only a sample of wafers are scanned, there is a high risk of Pt residues going undetected out of the NiSi module.

To prevent organic material (out of the cleanroom air or minienvironment of the tool) from reaching the wafers and forming Pt—C complexes, organic filters have been installed in RTA tools. Such filters initially appeared to reduce the number of Pt excursions, but recurrences of Pt excursions have been observed even after replacement of the organic filters. Pt excursions may not necessarily be detected after the second RTA, but become pronounced after the spacer shaper etch (etching back the spacers to increase the spaces between the gates for strain liner deposition) passivation clean downstream.

Attempts to eliminate Pt excursions also include a Pt rework procedure including three steps: 1) introduce oxygen plasma (or $O_2$ flash) to break the Pt—C bonds of the Pt—C complex; 2) perform an SPM clean to wet strip the organic residues; and 3) apply Aqua Regia to form chloroplatinate from non-bonded Pt. Such a rework has proven to be 99% effective as long as Pt—O complexes have not already formed. However, in cases where Pt is already present as Pt—O before the rework procedure, the rework is ineffective. Also, applying the rework sequence directly after the second RTA is impossible, since the $O_2$ flash creates Pt—O complexes which are not removable by the Aqua Regia.

A need therefore exists for methodology enabling removal of Pt excursions on all wafers while maintaining a high through-put.

SUMMARY

An aspect of the present disclosure is a method of forming Pt-containing NiSi in which an $O_2$ flash is added to the spacer shaper etch step mentioned above, followed by cleaning and applying Aqua Regia.

Another aspect of the present disclosure is semiconductor device including Pt-containing NiSi which is at least 99% free from unreacted Pt residues.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: sputter depositing a layer of nickel (Ni)/platinum (Pt) from a Ni/Pt target on a semiconductor substrate, for example a silicon substrate; annealing the deposited Ni/Pt layer; wet stripping unreacted Ni; annealing the Ni stripped Ni/Pt layer; stripping unreacted Pt from the annealed Ni stripped Ni/Pt layer; treating the resulting Pt stripped Ni/Pt layer with an oxygen plasma; cleaning the Ni/Pt layer; and stripping unreacted Pt from the cleaned Ni/Pt layer.

Aspects of the present disclosure include stripping unreacted Pt by applying Aqua Regia. Further aspects include forming gate electrodes on the semiconductor substrate; forming spacers on each side of the gate electrodes; sputter depositing the Ni/Pt layer between the spacers; and etching and shaping the spacers concurrently with treating the Ni/Pt layer with oxygen plasma. Another aspect includes treating the Ni/Pt layer with the oxygen plasma at a temperature less than 400° C. Additional aspects include treating the Ni/Pt layer with the oxygen plasma at a pressure of 350 mTorr to 8000 mTorr. Other aspects include wet stripping unreacted Ni with a sulfuric acid-hydrogen peroxide mixture (SPM). Further aspects include wet stripping Ni with SPM at a temperature between 90° C. and 180° C. Another aspect includes cleaning the Ni/Pt layer with an SPM/ammonia and peroxide mixture (APM) clean. Additional aspects include forming nitride strain layers on and between the gate electrodes subsequent to stripping unreacted Pt from the cleaned Ni/Pt layer. Further aspects include annealing the Ni/Pt layer and the Ni stripped Ni/Pt layer by rapid thermal anneal (RTA).

Another aspect of the present disclosure is a device including: a semiconductor substrate; gate electrodes on the semiconductor substrate; spacers on each side of each gate electrode; and platinum-containing nickel silicide on the substrate adjacent each spacer, wherein the device is at least 99% free from unreacted platinum residues.

Aspects include a device including nitride strain layers on and between the gate electrodes. Further aspects include a device including platinum-containing nickel silicide formed by: sputter depositing a layer of nickel (Ni)/platinum (Pt) from a Ni/Pt target on the substrate; performing a first RTA; wet stripping unreacted Ni; performing a second RTA; stripping unreacted Pt from the annealed Ni/Pt layer; treating the Pt stripped Ni/Pt layer with an oxygen plasma; cleaning the Ni/Pt layer with an SPM/APM clean; and stripping unreacted Pt from the cleaned Ni/Pt layer. Another aspect includes a device the unreacted Pt is stripped by applying Aqua Regia. Other aspects include a device including spacers that are etched and shaped concurrently with treating a Ni/Pt layer with the oxygen plasma. Additional aspects include a device including a Ni/Pt layer treated with the oxygen plasma at a temperature less than 400° C. Further aspects include a device including a Ni/Pt layer treated with the oxygen plasma at a pressure of 350 mTorr to 8000 mTorr. Other aspects include a device having unreacted Ni wet stripped with a sulfuric acid-hydrogen peroxide mixture (SPM) at a temperature between 90° C. and 180° C.

Another aspect of the present disclosure is a method including: forming gate electrodes on a silicon substrate; forming spacers on the gate electrodes; sputter depositing Ni and Pt on the silicon substrate, the gate electrodes, and the spacers; performing a first RTA; applying SPM at a temperature between 90° C. and 180° C.; performing a second RTA; applying a first Aqua Regia; performing an oxygen ($O_2$) flash at a temperature less than 400° C. and at a pressure of 350 mTorr to 8000 mTorr.; cleaning the Ni/Pt layer; and applying a second Aqua Regia. Aspects include forming dual stress liners on the gate electrodes, spacers, and silicon substrate subsequent to the second application of Aqua Regia.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of platinum excursions attendant upon forming NiSi. In accordance with embodiments of the present disclosure, an $O_2$ flash is included with the spacer shaper etch, followed by an SPM/ammonia and peroxide mixture (APM) clean and a second application of Aqua Regia. The $O_2$ flash breaks the Pt—C bonds of any Pt—C complex, and the second application of Aqua Regia can then strip the unreacted Pt.

Methodology in accordance with embodiments of the present disclosure includes sputter depositing a layer of nickel (Ni)/platinum (Pt) from a Ni/Pt target on a semiconductor substrate, e.g., a silicon substrate, annealing the deposited Ni/Pt layer, wet stripping unreacted Ni, annealing the Ni stripped Ni/Pt layer, stripping unreacted Pt from the annealed Ni stripped Ni/Pt layer, treating the resulting Pt stripped Ni/Pt layer with an oxygen plasma, cleaning the Ni/Pt layer, and stripping unreacted Pt from the cleaned Ni/Pt layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
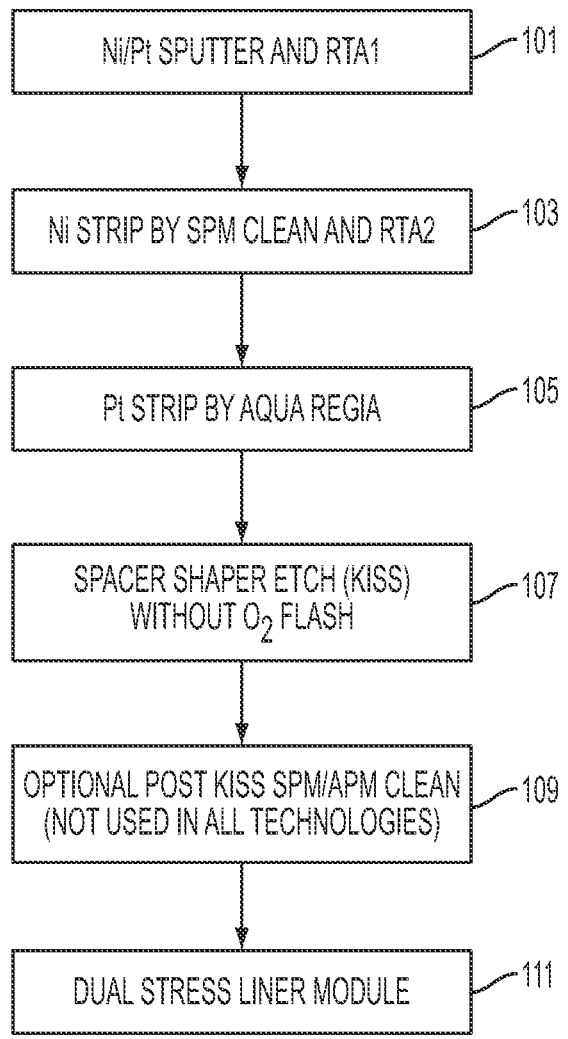
FIG. 1 illustrates a current process flow for forming NiSi in a semiconductor device.
Figure 2:
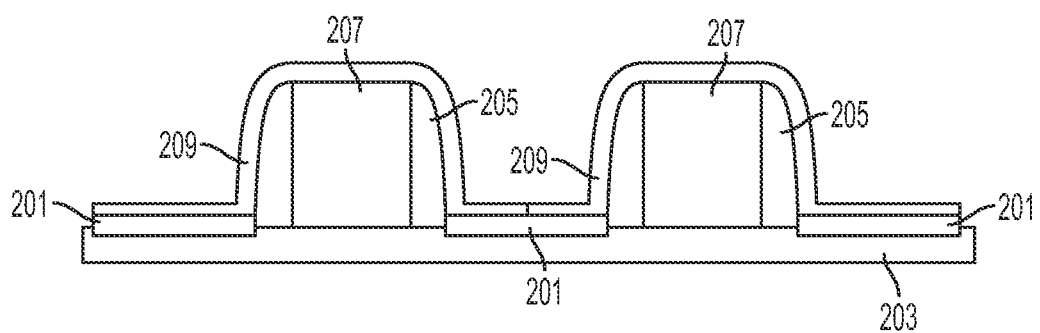
FIG. 2 schematically illustrates a semiconductor device including NiSi.

FIG. 1 illustrates a conventional process flow for forming NiSi 201 in a semiconductor device such as that illustrated in FIG. 2, particularly for 40 nm technologies. Ni/Pt is sputtered over the entire substrate 203, and a first RTA is performed, as shown in step 101. Adverting to step 103, unreacted Ni (Ni that is not on Si or has not reacted completely with the Si) is stripped by an SPM clean, and a second RTA is performed. In step 105, unreacted Pt is stripped by applying Aqua Regia. Spacers 205 (formed at each side of a gate electrode 207) are then etched and shaped, such as with an isotropic spacer shaper etch (SSE) process, to widen the space between the gates for nitride strain layers 209 (step 107). The spacers are etched and shaped with no special $O_2$ flash at the end of the RIE process. As shown in step 109, an optional post SSE SPM/APM clean may be employed, depending on the technology. The process ends with a dual stress liner module (step 111) for forming the nitride strain layers 209 around and between the gate electrodes 207.

Figure 3:
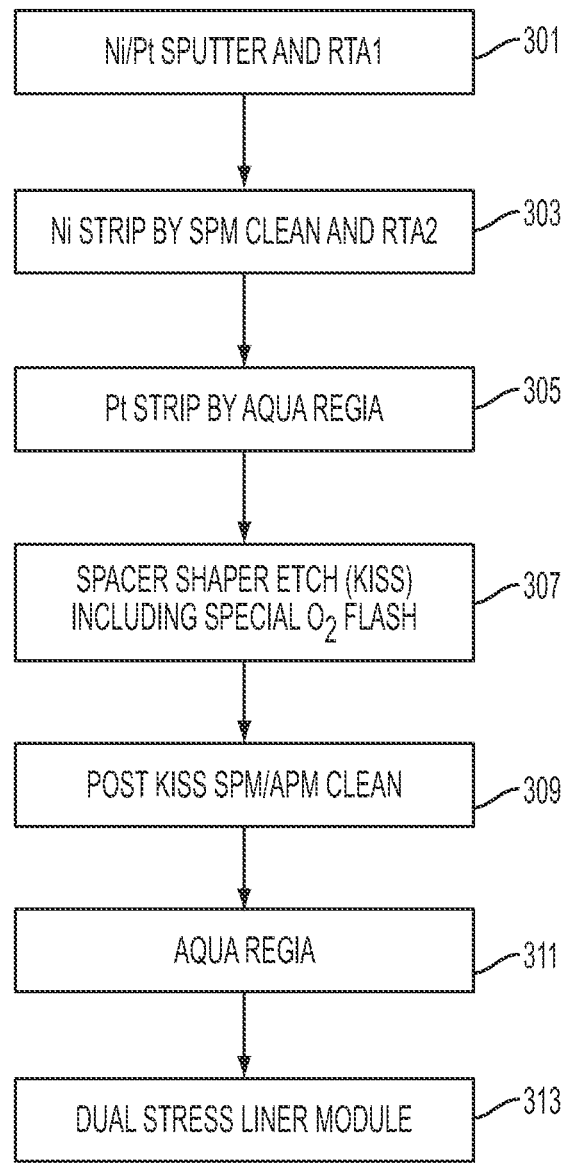
FIG. 3 illustrates a process flow for forming NiSi in a semiconductor device, in accordance with an exemplary embodiment.

As illustrated in FIG. 3, a process flow for forming NiSi 201 in a semiconductor device such as that shown in FIG. 2, in accordance with embodiments of the present disclosure, incorporates an $O_2$ flash to the spacer shaper etch, employs a post SSE SPM/APM clean for all products, and applies Aqua Regia a second time after the post SSE SPM/APM clean.

The initial process flow is similar to that of the process flow illustrated in FIG. 1. Adverting to step 301, Ni/Pt is sputtered over the entire substrate 203, and a first RTA is performed, as in the conventional process flow. Similarly, in step 303, unreacted Ni is stripped by an SPM clean and a second RTA is performed, and in step 305, unreacted Pt is stripped by applying Aqua Regia, all as in the current process flow. The SPM clean is performed at a temperature of 90° C. and 180° C.

As shown in step 307, an $O_2$ flash ($O_2$ plasma) is applied during etching and shaping of the spacers 205 (SSE). The $O_2$ flash may be performed at a temperature between 200° C. and 400° C., for example at 250° C. Temperatures above 400° C. could oxidize and/or otherwise damage the NiSi 201. The plasma source may be a 13.56 megahertz (MHz) inductive coupled plasma with a patented faraday shield. An example of the $O_2$ plasma process includes four steps, the first applying 8000 sccm of $O_2$ at a pressure of 8000 millitorr (mTorr) and a delay of 15 seconds (s). For step two, 2000 sccm of $O_2$ and 500 sccm of $N_2H_2$ are applied at a pressure of 350 mTorr, at an RF power of 600 watts (W), for an RF time of 3 s, and a delay of 7 s. In the third step, 7000 sccm of O$_2$ and 750 sccm of N$_2$H$_2$ are applied at a pressure of 700 mTorr, at an RF power of 2500 watts (W), for an RF time of 75 s, with no delay. In the fourth step, 8000 sccm of O$_2$ is applied at a pressure of 1000 mTorr, at an RF power of 0 watts (W), with a 5 s delay. The O$_2$ flash breaks the Pt—C like residues into Pt and organic parts, and since the O$_2$ flash occurs after the Pt strip, no non-bound Pt should remain for forming Pt—O residues.

Adverting to step 309, a post SSE SPM/APM clean is performed, regardless of technology, to remove the organic parts formed by the O$_2$ flash in the previous step. Since the post SSE SPM clean is already implemented in some products, the use of this step does not add complexity to the process flow.

In step 311, a second Pt strip by Aqua Regia is implemented to remove the Pt that survived the first Aqua Regia strip. In particular, the second Aqua Regia removes the Pt split from the Pt—C residues by the O$_2$ flash. A dual stress liner module may then be carried out (step 313), as in the current process flow, for forming stress liners 209.

The embodiments of the present disclosure can achieve several technical effects, including removal of Pt residues on all wafers without damaging high K metals and without a significant increase in process complexity, while maintaining high yield. The present disclosure enjoys industrial applicability in any of various types of highly integrated semiconductor devices that include a NiSi module, especially gate first technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   sputter depositing a layer of nickel (Ni)/platinum (Pt) from a Ni/Pt target on a semiconductor substrate;
   annealing the deposited Ni/Pt layer;
   wet stripping unreacted Ni;
   annealing the Ni stripped Ni/Pt layer;
   stripping unreacted Pt from the annealed Ni stripped Ni/Pt layer;
   treating the resulting Pt stripped Ni/Pt layer with an oxygen plasma;
   cleaning the Ni/Pt layer; and
   stripping unreacted Pt from the cleaned Ni/Pt layer.

2. The method according to claim 1, comprising stripping unreacted Pt by applying Aqua Regia.

3. The method according to claim 2, further comprising:
   forming gate electrodes on the semiconductor substrate;
   forming spacers on each side of the gate electrodes;
   sputter depositing the Ni/Pt layer between the spacers; and
   etching and shaping the spacers concurrently with treating the Ni/Pt layer with oxygen plasma.

4. The method according to claim 3, comprising treating the Ni/Pt layer with the oxygen plasma at a temperature less than 400° C.

5. The method according to claim 4, comprising treating the Ni/Pt layer with the oxygen plasma at a pressure of 350 mTorr to 8000 mTorr.

6. The method according to claim 5, further comprising wet stripping unreacted Ni with a sulfuric acid-hydrogen peroxide mixture (SPM).

7. The method according to claim 5, comprising wet stripping Ni with SPM at a temperature between 90° C. and 180° C.

8. The method according to claim 5, comprising cleaning the Ni/Pt layer with an SPM/ammonia and peroxide mixture (APM) clean.

9. The method according to claim 5, comprising forming nitride strain layers on and between the gate electrodes subsequent to stripping unreacted Pt from the cleaned Ni/Pt layer.

10. The method according to claim 5, comprising annealing the Ni/Pt layer and the Ni stripped Ni/Pt layer by rapid thermal anneal (RTA).

11. A method comprising:
    forming gate electrodes on a silicon substrate;
    forming spacers on the gate electrodes;
    sputter depositing Ni and Pt on the silicon substrate, the gate electrodes, and the spacers;
    performing a first RTA;
    applying SPM at a temperature between 90° C. and 180° C.;
    performing a second RTA;
    applying a first Aqua Regia;
    performing an oxygen (O$_2$) flash at a temperature less than 400° C. and at a pressure of 350 mTorr to 8000 mTorr.;
    cleaning the Ni/Pt layer; and
    applying a second Aqua Regia.

12. The method according to claim 11, further comprising forming dual stress liners on the gate electrodes, spacers, and silicon substrate subsequent to the second application of Aqua Regia.

\* \* \* \* \*